United States Patent
Mita et al.

(10) Patent No.: US 11,456,215 B2
(45) Date of Patent: Sep. 27, 2022

(54) MANUFACTURING METHOD FOR SEMICONDUCTOR DEVICE

(71) Applicant: NITTO DENKO CORPORATION, Ibaraki (JP)

(72) Inventors: Ryota Mita, Ibaraki (JP); Tomoaki Ichikawa, Ibaraki (JP)

(73) Assignee: NITTO DENKO CORPORATION, Ibaraki (JP)

( * ) Notice: Subject to any disclaimer, the term of this patent is extended or adjusted under 35 U.S.C. 154(b) by 0 days.

(21) Appl. No.: 17/253,727

(22) PCT Filed: Mar. 27, 2019

(86) PCT No.: PCT/JP2019/013142
§ 371 (c)(1),
(2) Date: Dec. 18, 2020

(87) PCT Pub. No.: WO2020/003663
PCT Pub. Date: Jan. 2, 2020

(65) Prior Publication Data
US 2021/0193523 A1 Jun. 24, 2021

(30) Foreign Application Priority Data
Jun. 26, 2018 (JP) .............................. JP2018-120436

(51) Int. Cl.
*H01L 21/78* (2006.01)
*H01L 21/683* (2006.01)
*H01L 23/00* (2006.01)

(52) U.S. Cl.
CPC .......... *H01L 21/78* (2013.01); *H01L 21/6836* (2013.01); *H01L 24/29* (2013.01);
(Continued)

(58) Field of Classification Search
CPC ..... H01L 21/78; H01L 21/6836; H01L 24/29; H01L 24/83; H01L 2224/29339;
(Continued)

(56) References Cited

U.S. PATENT DOCUMENTS 9,484,260 B2 * 11/2016 Grivna .................... H01L 21/78
10,748,866 B2 8/2020 Sugo et al.
(Continued)

FOREIGN PATENT DOCUMENTS

EP 3 787 011 A1 3/2021
JP 2011-119767 A 6/2011
(Continued)

OTHER PUBLICATIONS

International Search Report of PCT/JP2019/013142 dated May 21, 2019 [PCT/ISA/210].
(Continued)

*Primary Examiner* — Vu A Vu
(74) *Attorney, Agent, or Firm* — Sughrue Mion, PLLC

(57) ABSTRACT

A manufacturing method includes the step of laminating a sheet assembly onto chips arranged on a processing tape, where the sheet assembly has a multilayer structure including a base and a sinter-bonding sheet and is laminated so that the sinter-bonding sheet faces the chips, and subsequently removing the base B from the sinter-bonding sheet. The chips on the processing tape are picked up each with a portion of the sinter-bonding sheet adhering to the chip, to give sinter-bonding material layer-associated chips. The sinter-bonding material layer-associated chips are temporarily secured through the sinter-bonding material layer to a substrate. The sinter-bonding material layers lying between the temporarily secured chips and the substrate are converted through a heating process into sintered layers, to bond the chips to the substrate. The semiconductor device manu-
(Continued)

facturing method is suitable for efficiently supplying a sinter-bonding material to semiconductor chips while reducing loses of the sinter-bonding material.

10 Claims, 9 Drawing Sheets

(52) U.S. Cl.
CPC .... *H01L 24/83* (2013.01); *H01L 2224/29339* (2013.01); *H01L 2224/29347* (2013.01); *H01L 2224/8384* (2013.01)

(58) Field of Classification Search
CPC ... H01L 2224/29347; H01L 2224/8384; H01L 21/67132; H01L 21/561; H01L 2221/68322; H01L 2221/68354; H01L 2221/68381; H01L 2224/73265; H01L 2224/83191; H01L 2224/92247; H01L 2924/181
USPC ........................................................ 438/113
See application file for complete search history.

(56) References Cited

U.S. PATENT DOCUMENTS

| | | | |
|---|---|---|---|
| 10,821,543 | B2 | 11/2020 | Kamakura et al. |
| 2018/0190876 | A1* | 7/2018 | Liu .......................... H01L 33/44 |
| 2019/0043824 | A1 | 2/2019 | Sugo et al. |
| 2019/0047081 | A1 | 2/2019 | Kamakura et al. |
| 2020/0048504 | A1 | 2/2020 | Sugo et al. |

FOREIGN PATENT DOCUMENTS

| | | |
|---|---|---|
| JP | 2013-039580 A | 2/2013 |
| JP | 2016-127115 A | 7/2016 |
| JP | 2017-069559 A | 4/2017 |
| JP | 2017-164782 A | 9/2017 |
| JP | 2017-171981 A | 9/2017 |
| JP | 2017-224782 A | 12/2017 |
| WO | 2008/065728 A1 | 6/2008 |
| WO | 2018/179796 A1 | 10/2018 |

OTHER PUBLICATIONS

Partial Supplementary European Search Report dated Jul. 7, 2022 from The European Patent Office in No. 19824598.7.

* cited by examiner

[FIG. 1]

[FIG. 3]
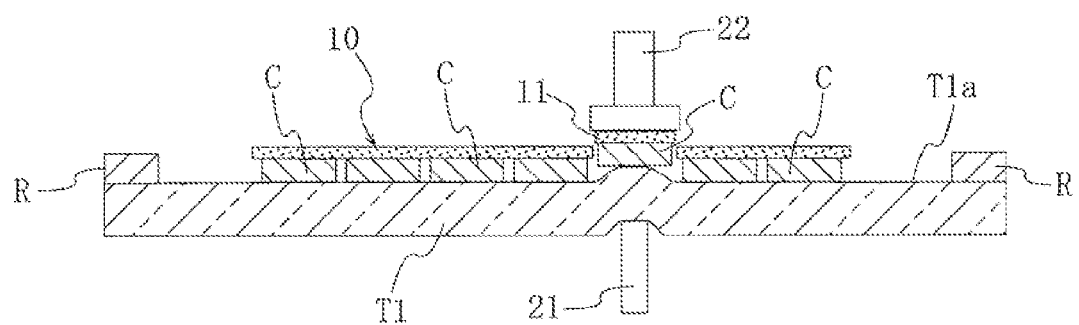
[FIG. 4]
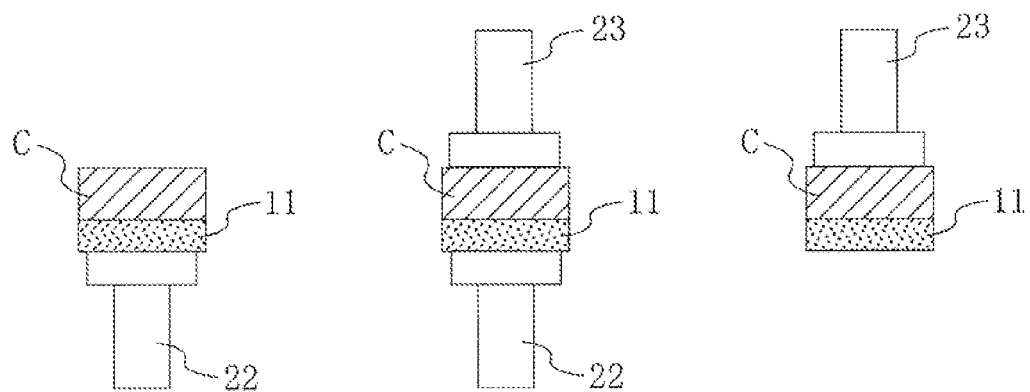

[FIG. 9]
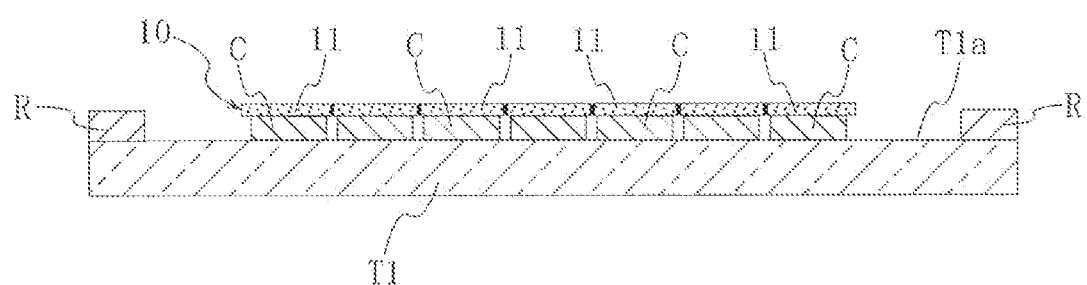
[FIG. 10]
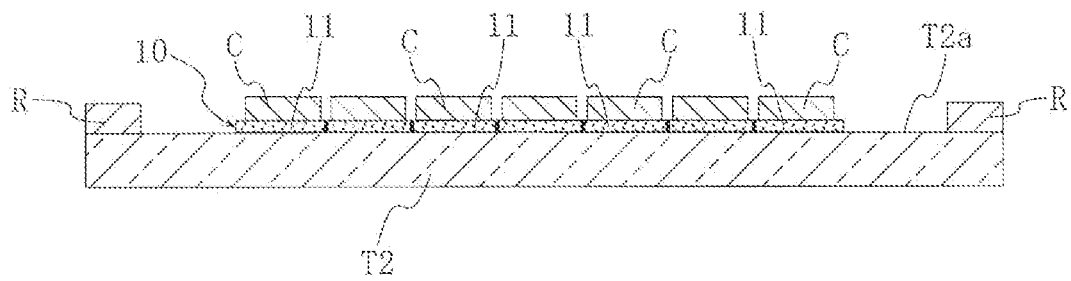

MANUFACTURING METHOD FOR SEMICONDUCTOR DEVICE

CROSS REFERENCE TO RELATED APPLICATIONS

This application is a National Stage of International Application No. PCT/JP2019/013142 filed on Mar. 27, 2019, claiming priority based on Japanese Patent Application No. 2018-120436 filed on Jun. 26, 2018.

TECHNICAL FIELD

The present invention relates to methods for manufacturing semiconductor devices such as so-called power semiconductor devices.

BACKGROUND ART

In some semiconductor device productions, a semiconductor chip is die-bonded to a supporting substrate such as a lead frame or an insulated substrate (insulated circuit board) while establishing and keeping electrical connection with the supporting substrate. Known examples of this technique include a technique of forming a Au—Si eutectic alloy layer between the supporting substrate and the chip to actually provide a bonding state; and a technique of using a bonding material such as solder, or a resin containing conductive particles.

Power semiconductor devices, which assume power supply and control, have become remarkably widespread. Many of such power semiconductor devices output large heat due to the passage of large current during operation. The power semiconductor device productions therefore require a technique that can actually provide a highly reliable bonding state even in a high-temperature operation, in die-bonding of semiconductor chips onto a supporting substrate while allowing the semiconductor chips to establish and keep electrical connection with the supporting substrate. In particular, this requirement is significant in power semiconductor devices that employ SiC or GaP as a semiconductor material and are to operate at high temperatures. To meet the requirement with electrical connection, a proposed die bonding technique employs a material for sinter bonding (sinter-bonding material) containing, for example, sinterable particles and a solvent (vehicle).

In such die bonding using a sinter-bonding material containing sinterable particles, initially, a semiconductor chip is placed on a predetermined chip-mounting area of a supporting substrate, through the sinter-bonding material under predetermined temperature-load conditions. Then, between the supporting substrate and the semiconductor chip over the supporting substrate, a heating process operates under predetermined temperature-pressurization conditions so that the solvent in the sinter-bonding material undergoes, for example, volatilization and the sintering proceeds between the sinterable particles. This forms a sintered layer between the supporting substrate and the semiconductor chip and allows the semiconductor chip to electrically connect with, and mechanically bond to, the supporting substrate. The technique as above is taught typically by Patent Literature (PTL) 1 and PTL 2 as follows.

CITATION LIST

Patent Literature

PTL 1: PCI International Publication Number 902008/065728
PTL 2: Japanese Unexamined Patent Application Publication (JP-A) No. 2013-09580

SUMMARY OF INVENTION

Technical Problem

Some conventional semiconductor device manufacturing processes using die bonding through sinter bonding may perform coating of semiconductor chips with a pasty composition containing sinterable particles on an individual chip basis. This technique, however, is inefficient.

Another possible technique for use in semiconductor device manufacturing processes including die bonding through sinter bonding is the technique of laminating a sheet of a sinter-bonding material containing sinterable particles onto a semiconductor wafer on which semiconductor elements have been built, and then dicing (singularizing) the semiconductor wafer with the sheet by blade dicing. This technique, however, may suffer from large losses of the sinter-bonding material in some yields of the elements to be built in the semiconductor wafer. For example, manufacture of power semiconductor devices using SiC or GaN as a semiconductor material may suffer from insufficiently high yields of semiconductor elements to be built in the wafer made of the semiconductor material. In this case, the technique of laminating the sinter-bonding material sheet onto the semiconductor wafer before dicing into semiconductor chips suffers from relatively large losses of the sinter-bonding material. This is because the sinter-bonding material is supplied not only to non-defective chips, but also to defective chips. With a decreasing yield of elements to be built in a semiconductor wafer, losses of the sinter-bonding material tend to increase.

The present invention has been made under these circumstances and has an object to provide a manufacturing method for a semiconductor device including semiconductor chips in sinter-bonded areas, which method is suitable for efficiently supplying a sinter-bonding material to the semiconductor chips while reducing losses of the sinter-bonding material.

Solution to Problem

The present invention provides, in a first aspect, a semiconductor device manufacturing method that includes an arrangement step, a transfer step, a picking-up step, a temporary securing step, and a sinter bonding step as described below. The method according to the aspect is suitable for manufacturing power semiconductor devices and other semiconductor devices including semiconductor chips in sinter-bonded areas.

In the arrangement step, semiconductor chips are arranged on an adhesive face of a processing tape. Spacing between adjacent semiconductor chips is typically 50 to 2000 μm, preferably 50 to 1000 μm, and more preferably 50 to 700 μm, while the spacing may be set depending typically on the viscosity and/or the thickness of a sinter-bonding sheet for use in the manufacturing method according to the aspect.

In the transfer step, initially, a sheet assembly is laminated onto the semiconductor chips on the processing tape through compression bonding, where the sheet assembly has a multilayer structure including a base and a sinter-bonding sheet and is laminated so that the sinter-bonding sheet faces the semiconductor chips. Preferably, the sinter-bonding sheet contains a binder component, and sinterable particles containing a conductive metal. Next, the base is removed from the sinter-bonding sheet while leaving the sinter-bonding sheet on the semiconductor chips.

In the picking-up step, each semiconductor chip on the processing tape is picked up together with a portion of the sinter-bonding sheet adhering to the semiconductor chip, to give sinter-bonding material layer-associated semiconductor chips. When the step of dividing the sinter-bonding sheet into pieces is not performed before the picking-up step, the picking-up step operates to divide the sinter-bonding sheet into pieces each forming a sinter-bonding material layer on each semiconductor chip.

In the temporary securing step, the sinter-bonding material laver-associated semiconductor chips are compression-bonded and temporarily secured through the sinter-bonding material layer to a substrate.

In the sinter bonding step, the sinter-bonding material layers lying between the temporarily secured semiconductor chips and the substrate are converted, through a heating process, into sintered layers, to sinter-bond the semiconductor chips to the substrate.

The semiconductor device manufacturing method according to the aspect includes the arrangement step as above. In the arrangement step, known good dies (KGDs) can be selected from among produced semiconductor chips and arranged on the processing tape, where the known good dies are chips that are acknowledged as non-defective chips through inspections after production process. The manufacturing method according to the aspect therefore enables batchwise transfer (transfer in one operation) of the sinter-bonding sheet serving as a sinter-bonding material to KGDs (semiconductor chips) alone in the transfer step by arranging KGDs alone as semiconductor chips on a processing tape and subjecting this processing tape bearing the KGDs alone to the transfer step. The manufacturing method according to the aspect as above is suitable for eliminating or minimizing supply of a sinter-bonding material to semiconductor chips that are acknowledged as defective ones, and suitable for reducing losses of the sinter-bonding material in batchwise supply of the sinter-bonding material to semiconductor chips.

The transfer step of the manufacturing method according to the aspect includes laminating the sinter-bonding sheet (sinter-bonding material) side of the sheet assembly onto the semiconductor chips on the processing tape, and removing the base of the sheet assembly while leaving the sinter-bonding sheet on the processing tape or on the semiconductor chips, as described above. The configuration as above is suitable for efficient batchwise supply of a sinter-bonding material to each of semiconductor chips.

In addition, the manufacturing method according to the aspect performs the arrangement step at a short chip-to-chip spacing of the semiconductor chips to be arranged on the processing tape, namely, at a short spacing between adjacent semiconductor chips, so as to leave the sinter-bonding sheet on the semiconductor chips upon removal of the base in the transfer step. The chip-to-chip spacing is typically 50 to 2000 μm, preferably 50 to 1000 μm, and more preferably 50 to 700 μm, as described above. Assume that the step of laminating a sinter-bonding sheet side of a sheet assembly having a multilayer structure including a base and the sinter-bonding sheet onto chips on a processing tape, and subsequently removing the base of the sheet assembly is performed at an excessively long chip-to-chip spacing. In this case, a portion or the sinter-bonding sheet is removed as being associated with the sheet assembly base upon removal of the base. Such removed portions of the sinter-bonding sheet lead to losses of the sinter-bonding material. In contrast, with the manufacturing method according to the embodiment, the chip-to-chip spacing of the chips C to be arranged on the processing tape in the arrangement step is set to such an extent as to avoid the removal of the sinter-bonding sheet in the transfer step as above, while the chip-to-chip spacing may be determined according typically to the viscosity and/or the thickness of the sinter-bonding sheet to be used. The configuration as above is suitable for reducing losses of the sinter-bonding material.

As described above, the semiconductor device manufacturing method according to the present invention is suitable for efficiently supplying a sinter-bonding material to each of semiconductor chips while reducing loses of the sinter-bonding material.

The manufacturing method according to the aspect preferably further includes an expansion step between the transfer step and the picking-up step. In the expansion step, the processing tape that holds the semiconductor chips adhering to one sinter-bonding sheet temporarily expands, to cleave the sinter-bonding sheet on the semiconductor chips into pieces each forming a sinter-bonding material layer on each semiconductor chip. The configuration as above is preferred in the picking-up step for appropriately picking up a target semiconductor chip with a sinter-bonding material layer which has already been separated from an adjacent sinter-bonding material layer or layers.

The manufacturing method according to the aspect preferably further includes a blade dicing step between the transfer step and the picking-up step. In the blade dicing step, blade dicing is performed on the sinter-bonding sheet adhering to the semiconductor chips held by the processing tape, to divide the sinter-bonding sheet into pieces each forming a sinter-bonding material layer on each semiconductor chip. The configuration as above is preferred in the picking-up step for appropriately picking up a target semiconductor chip with a sinter-bonding material layer which has already been separated from an adjacent sinter-bonding material layer or layers.

The manufacturing method according to the aspect preferably further includes a bending step between the transfer step and the picking-up step. In the bending step, the processing tape that holds the semiconductor chips adhering to one sinter-bonding sheet is bent, to cleave the sinter-bonding sheet on the semiconductor chips into pieces each forming a sinter-bonding material layer on each semiconductor chip. The "bending" of the processing tape includes "bending" and "curving" of the processing tape. The configuration as above is preferred in the picking-up step for appropriately picking up a target semiconductor chip with a sinter-bonding material layer which has already been separated from an adjacent sinter-bonding material layer or layers.

The sintered layers formed in the sinter bonding step each have a thickness of preferably from 60% to 140%, more preferably from 80% to 120%, and still more preferably from 90% to 110%, of the average thickness of the sintered layers. With increasing uniformity in the thicknesses of the sintered layers, the sintered layers more tend to provide high bonding reliability. The sintered layers formed in the sinter bonding step have an average thickness of preferably 5 to 200 µm, and more preferably 10 to 150 µm. The configuration as above is preferred for relaxing internal stress in the sintered layers, where the internal stress is caused by heat stress, to surely provide sufficient thermal shock reliability, and for reducing not only sinter bonding cost, but also semiconductor device manufacturing cost.

The sinterable particles in the sinter-bonding sheet for use in the manufacturing method according to the aspect preferably include at least one selected from the group consisting of silver, copper, silver oxide, and copper oxide. The configuration as above is advantageous for the formation of firm, strong sintered layers between the substrate and the semiconductor chips which are sinter-bonded to each other. The binder component in the sinter-bonding sheet is preferably a thermally decomposable polymer binder.

BRIEF DESCRIPTION OF DRAWINGS

FIG. 3 illustrates a step subsequent to the steps illustrated in FIG. 2;

FIG. 4 illustrates a step subsequent to the step illustrated in FIG. 3;

FIG. 9 illustrates part of steps in a semiconductor device manufacturing method according to one embodiment of the present invention;

FIG. 10 illustrates part of steps in a semiconductor device manufacturing method according to one embodiment of the present invention.

DESCRIPTION OF EMBODIMENTS

FIGS. 1 to 6 illustrate a semiconductor device manufacturing method according to one embodiment of the present invention. The semiconductor device manufacturing method according to the embodiment is a method for manufacturing a power semiconductor device or another semiconductor device including semiconductor chips in sinter-bonded areas and includes an arrangement step, a transfer step, a picking-up step, a temporary securing step, and a sinter bonding step as follows.

Figure 1:
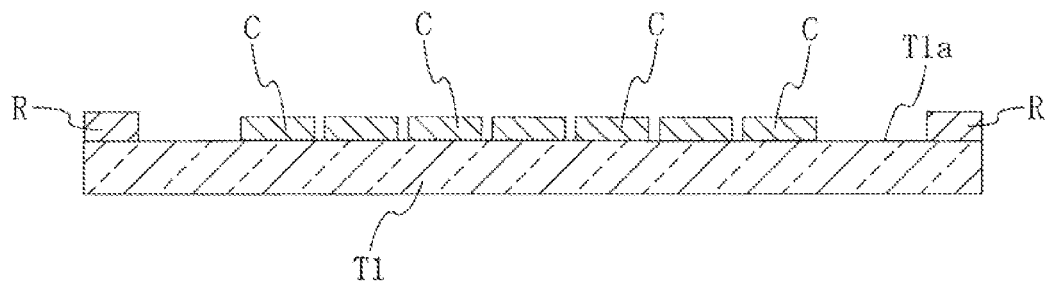
FIG. 1 illustrates part of steps in a semiconductor device manufacturing method according to one embodiment of the present invention.

In the arrangement step, chips C are arranged on a processing tape T1, as illustrated in FIG. 1. The processing tape T1 typically has a multilayer structure including a carrier (base) and a pressure-sensitive adhesive layer and has, on one side, an adhesive face T1a defined by the pressure-sensitive adhesive layer. To the periphery of the adhesive face T1a of the processing tape T1, a ring frame R adheres. The ring frame R is a member with which a conveying mechanism, such as a conveying arm, is in mechanical contact upon conveying of the work while the ring frame R is adhering to the processing tape T1. The chips C are semiconductor chips as KGDs, which are acknowledged as non-defective chips through inspections. The chips C adhere to the adhesive face T1a of the processing tape T1 and each have a principal side (the lower side in FIG. 1) on which semiconductor elements have been built, and a back side (the upper side in FIG. 1) opposite to the principal side. On the back side, a plane electrode (not shown) working as an external electrode is formed. Non-limiting examples of a material to constitute the chip body of the chips C include silicon carbide (SiC), gallium nitride (GaN), and other semiconductor materials for semiconductor devices. The chips C each have a thickness of typically 20 to 1000 µm.

Specifically, in the arrangement step, the chips C are arranged on the adhesive face Ta of the processing tape T1, with clearance (spacing) between adjacent chips. The spacing between adjacent chips C, namely, the chip-to-chip spacing is preferably 50 µm or more, and more preferably 100 µm or more, from the viewpoint of eliminating or minimizing the contact of a target chip C to be picked up with an adjacent chip (s) C in the after-mentioned picking-up step. The chip-to-chip spacing is typically 2000 µm or less, preferably 1000 µm or less, and more preferably 700 µm or less, from the viewpoint of eliminating or minimizing losses of the sinter-bonding material, where the loses will be caused by the removal of the sinter-bonding material in the transfer step, while the chip-to-chip spacing may be determined depending typically on the viscosity and/or the thickness of the after-mentioned sinter-bonding sheet.

Figure 2:
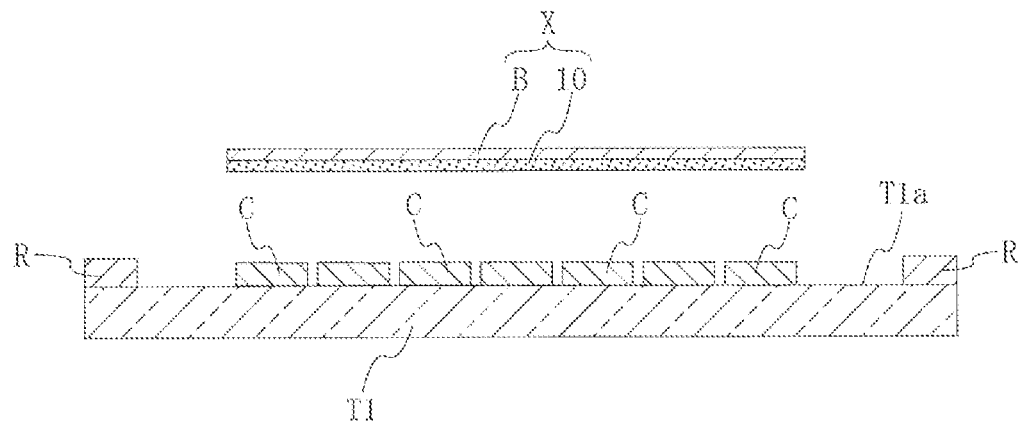
FIG. 2 (a) to FIG. 2 (c) illustrates steps subsequent to the step illustrated in FIG. 1.
Figure 2:
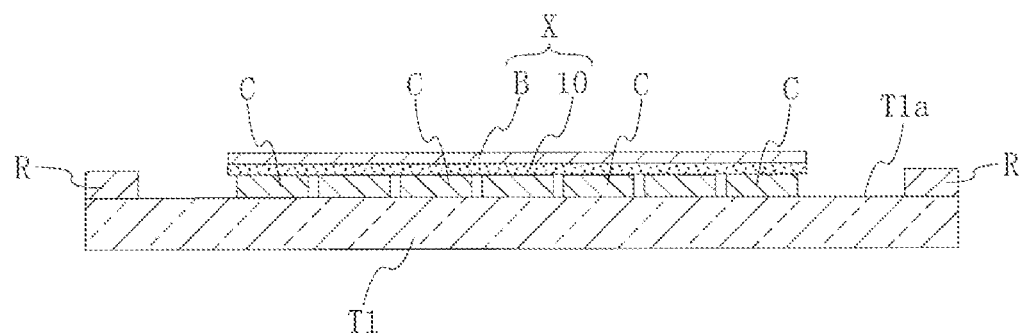
Figure 2:
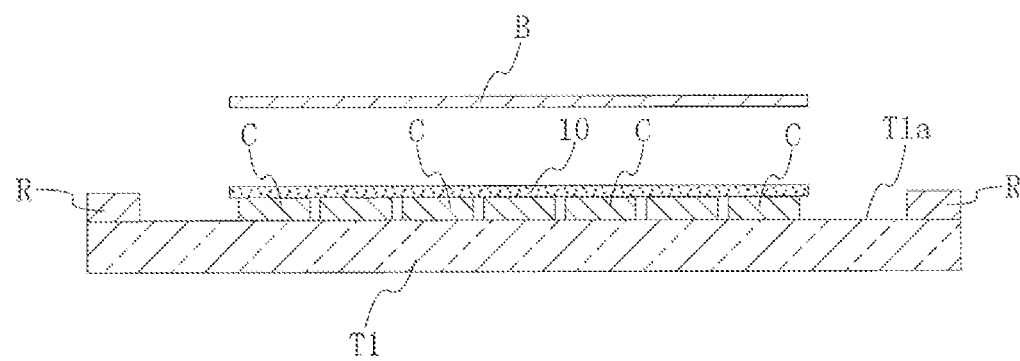

Next, the semiconductor device manufacturing method according to the embodiment performs the transfer step as illustrated in FIG. 2. In the step, initially, a sheet assembly X is laminated onto the chips C on the processing tape T1, as illustrated in FIGS. 2(a) and 2(b). The sheet assembly X has a multilayer structure including a base B and a sinter-bonding sheet 10. The base B is, for example, a plastic film. The sinter-bonding sheet 10 is a sheet-like sinter-bonding composition including a binder component, and sinterable particles containing a conductive metal. In the step, the sinter-bonding sheet 10 side of the sheet assembly X as above is compression-bonded and laminated onto the chips C. A non-limiting example of the pressing means or device for lamination is a pressure roller. The lamination operates at a temperature typically from room temperature to 200° C. under a load typically from 0.01 to 10 MPa. After the lamination, the base B is removed from the sinter-bonding sheet 10 while the sinter-bonding sheet 10 remains on the chip C, as illustrated in FIG. 2(c). This step enables supply of the sinter-bonding material to each of the chips C by batch (by one operation).

The sinter-bonding sheet 10 is used for sinter bonding between targets to be bonded and is a sheet-like sinter-bonding composition including conductive metal-containing sinterable particles and a binder component, as described above.

The sinterable particles in the sinter-bonding sheet 10 are particles that contain a conductive metal element and are sinterable. Non-limiting examples of the conductive metal element include gold, silver, copper, palladium, tin, and nickel. Non-limiting examples of a material to constitute the sinterable particles as above include gold, silver, copper, palladium, tin, and nickel; and alloys of two or more different metals selected from the group consisting of these metals. Non-limiting examples of the material to constitute the sinterable particles also include metal oxides such as silver oxide, copper oxide, palladium oxide, and tin oxide. The sinterable particles may also be particles having a core-shell structure. For example, the sinterable particles may be core-shell-structure particles, which include a core manly containing copper, and a shell mainly containing, for example, gold or silver and covering the core. In the embodiment, the sinterable particles preferably include at least one selected from the group consisting of silver particles, copper particles, silver oxide particles, and copper oxide particles. The sinterable particles are preferably selected from silver particles and copper particles, from the viewpoint of actually providing high electric conductivity and high thermal conductivity in the formed sintered layers. In addition, silver particles are easily handleable and are preferred from the viewpoint of oxidation resistance. For example, assume that a sintering process operates in sinter bonding of semiconductor chips to a silver-plated copper substrate, using a sintering material including copper particles as the sinterable particles. This sintering process has to operate in an inert environment such as a nitrogen atmosphere. However, a sintering process in sinter bonding using a sintering material including silver particles as the sinterable particles can operate appropriately even in an air atmosphere.

The sinterable particles for use herein have an average particle diameter (average particle size) of preferably 2000 nm or less, more preferably 800 nm or less, and still more preferably 500 nm or less, from the viewpoint typically of actually providing a low sintering temperature of the sinterable particles, to surely provide satisfactory sinterability. The sinterable particles have an average particle diameter of preferably 1 nm or more, more preferably 10 nm or more, and still more preferably 50 nm or more, from the viewpoint of allowing the sinterable particles to be satisfactorily dispersible in the sinter-bonding sheet 10 or in the composition to form the sheet 10. The average particle diameter of the sinterable particles can be measured by observation using a scanning electron microscope (SEM).

The sinter-bonding sheet 10 contains the sinterable particles in a proportion of preferably 60 to 99 mass percent, more preferably 65 to 98 mass percent, still more preferably 70 to 97 mass percent, and still more preferably 70 to 95 mass percent, from the viewpoint of actually providing highly reliable sinter bonding.

In the embodiment, the binder component in the sinter-bonding sheet 10 includes a thermally decomposable polymer binder and a low-boiling binder and may further include one or more other components such as a plasticizer. The thermally decomposable polymer binder is a binder component that is decomposable in a high-temperature heating process for sinter bonding, and is an element that contributes to a retained sheet form of the sinter-bonding sheet 10 before the heating process. In the embodiment, the thermally decomposable polymer binder is a material that is solid at room temperature (23° C.), from the viewpoint of surely providing sheet form retainability. Non-limiting examples of such thermally decomposable polymer binders include polycarbonate resins and acrylic resins.

Examples of the polycarbonate resins for use as the thermally decomposable polymer binder include aliphatic polycarbonates whose backbone is composed of an aliphatic chain and does not include, between carbonic acid ester groups (—O—CO—O—) in the backbone, benzene rings and other moieties derived from aromatic compounds; and aromatic polycarbonates which include a moiety derived from an aromatic compound between carbonic acid ester groups (—O—CO—O—) in the backbone. Non-limiting examples of the aliphatic polycarbonates include poly(ethylene carbonate)s and poly(propylene carbonate)s. Non-limiting examples of the aromatic polycarbonates include polycarbonates including a bisphenol-A structure in the backbone.

Examples of the acrylic resins for use as the thermally decomposable polymer binder include polymers of an acrylic ester and/or a methacrylic ester each having $C_4$-$C_{18}$ linear or branched alkyl. Hereinafter the term "(meth)acrylic" indicates "acrylic" and/or "methacrylic"; and the term "(meth)acrylate" indicates "acrylate" and/or "methacrylate". Non-limiting examples of the alkyl moiety (alkyl group) of the (meth) acrylic ester to form the acrylic resin as the thermally decomposable polymer binder include methyl, ethyl, propyl, isopropyl, n-butyl, t-butt, isobutyl, amyl, isoamyl, hexyl, heptyl, cyclohexyl, 2-ethylhexyl, octyl, isooctyl, nonyl, isononyl, decyl, isodecyl, undecyl, lauryl, tridecyl, tetradecyl, stearyl, and octadecyl.

The acrylic resin as the thermally decomposable polymer binder may also be a polymer further including a monomer unit derived from a monomer other than the (meth)acrylic esters. Examples of such other monomers include carboxy-containing monomers, acid anhydride monomers, hydroxy-containing monomers, sulfo-containing monomers, and phosphate-containing monomers. Specifically, non-limiting examples of the carboxy-containing monomers include acrylic acid, methacrylic acid, carboxyethyl acrylate, carboxypentyl acrylate, itaconic acid, maleic acid, fumaric acid, and crotonic acid. Examples of the acid anhydride monomers include, but are not limited to, maleic anhydride and itaconic anhydride. Non-limiting examples of the hydroxy-containing monomers include 2-hydroxyethyl (meth)acrylate, 2-hydroxypropyl (meth)acrylate, 4-hydroxybutyl (meth)acrylate, 6-hydroxyhexyl (meth)acrylate, 8-hydroxyoctyl (meth)acrylate, 10-hydroxydecyl (meth)acrylate, 12-hydroxylauryl (meth)acrylate, and 4-(hydroxymethyl)cyclohexylmethyl (meth)acrylate. Non-limiting examples of the sulfo-containing monomers include styrenesulfonic acid, allylsulfonic acid, 2-(meth)acrylamido-2-methylpropanesulfonic acid, (meth)acrylamidopropanesulfonic acid, sulfopropyl (meth)acrylate, and (meth)acryloyloxynaphthalenesulfonic acid. A non-limiting example of the phosphate-containing monomers is 2-hydroxyethylacryloyl phosphate.

The thermally decomposable polymer binder has a weight-average molecular weight of preferably 10000 or more. The "weight-average molecular weight" of the thermally decomposable polymer binder herein refers to a value measured by gel permeation chromatography (GPC) and calibrated with a polystyrene standard.

The sinter-bonding sheet 10 may contain the thermally decomposable polymer binder in a proportion of preferably 0.5 to 10 mass percent, more preferably 0.8 to 8 mass percent, and still more preferably 1 to 6 mass percent, from the viewpoint of appropriately exhibiting the function of sheet form retaining.

The "low-boiling binder" in the sinter-bonding sheet 10 refers to a binder that has a viscosity of $1 \times 10^5$ Pa·s or less and is liquid or semi-liquid at 23° C., where the viscosity as measured using a dynamic viscoelastometer (trade name HAAKE MARS III, supplied by Thermo Fisher Scientific). The viscosity measurement operates using 20-mm diameter parallel plates as fixtures at a plate-to-plate gap of 100 μm and a shear rate in rotary shearing of $1\ s^{-1}$.

Non-limiting examples of the low-boiling binder include terpene alcohols, alcohols other than terpene alcohols, alkylene glycol alkyl ethers, and ethers other than alkylene glycol alkyl ethers. Non-limiting examples of the terpene alcohols include isobornylcyclohexanol, citronellol, geraniol, nerol, carveol, and α-terpineol. Non-limiting examples of the alcohols other than terpene alcohols include pentanol, hexanol, heptanol, octanol, 1-decanol, ethylene glycol, diethylene glycol, propylene glycol, butylene glycol, and 2,4-diethyl-1,5pentanediol. Examples of the alkylene glycol alkyl ethers include ethylene glycol butyl ether, diethylene glycol methyl ether, diethylene glycol ethyl ether, diethylene glycol butyl ether, diethylene glycol isobutyl ether, diethylene glycol hexyl ether, diethylene glycol dimethyl ether, diethylene glycol diethyl ether, diethylene glycol dibutyl ether, diethylene glycol butyl methyl ether, diethylene glycol isopropyl methyl ether, triethylene glycol methyl ether, triethylene glycol dimethyl ether, triethylene glycol butyl methyl ether, propylene glycol propyl ether, dipropylene glycol methyl ether, dipropylene glycol ethyl ether, ddpropylene glycol propyl ether, dipropylene glycol butyl ether, dipropylene glycol dimethyl ether, tripropylene glycol methyl ether, and tripropylene dimethyl ether. Non-limiting examples of the ethers other than alkylene glycol alkyl ethers include ethylene glycol ethyl ether acetate, ethylene glycol butyl ether acetate, diethylene glycol ethyl ether acetate, diethylene glycol butyl ether acetate, and dipropylene glycol methyl ether acetate. The sinter-bonding sheet 10 may include each of different low-boiling binders alone or in combination. The low-boiling binder(s) in the sinter-bonding sheet 10 is preferably selected from terpene alcohols and is more preferably isobornylcyclohexanol, from the viewpoint of providing stability at room temperature.

The sinter-bonding sheet 10 has a thickness at 23° C. of preferably 5 μm or more, more preferably 10 μm or more; and preferably 300 μm or less, and more preferably 150 μm or less. The sinter-bonding sheet 10 or the sinter-bonding composition to form the sheet 10 has a viscosity at 70° C. of typically $5 \times 10^3$ to $1 \times 10^7$ Pa·s, and preferably $1 \times 10^4$ to $1 \times 10^6$ Pa·s.

The sinter-bonding sheet 10 may be slit along intended isolation lines. The depth of slitting (depth from the surface of the sinter-bonding sheet 10 opposite to the base B) is typically 20% to 100% of the thickness of the sinter-bonding sheet 10. The configuration as above relating to slitting of the sinter-bonding sheet 10 is preferred for appropriate dividing of the sinter-bonding sheet 10 into pieces as sinter-bonding material layers, as described later.

The sinter-bonding sheet 10 can be prepared typically by mixing the components in a solvent to give a varnish, applying the varnish onto the base B to form a coating, and drying the coating. Non-limiting examples of the solvent for the preparation of the varnish usable herein include organic solvents and alcohol solvents.

The semiconductor device manufacturing method according to the embodiment subsequently performs picking Up of a chip C together with a portion of the sinter-bonding sheet 10 adhering to the chip C from the processing tape T1, to give a series of sinter-bonding material layer-associated chips C (picking-up step), as illustrated in FIG. 3. Specifically, in the picking-up step according to the embodiment, the target chip C to be picked up is plunged up through the processing tape T1 by elevating a pin lifter 21 of a picking-up mechanism from below the processing tape T1 in the figure. In this procedure, the sinter-bonding sheet 10 on the target chip C is partially divided into a piece that forms a sinter-bonding material layer 11. After the picking up as above, the chip C is sucked and held by a suction collet 22 through the sucking action on the sinter-bonding material layer 11. A series of sinter-bonding material layer-associated chips C can be picked up by the procedure as above.

In the embodiment, next, the suction collet 22, which has picked up the sinter-bonding material layer-associated chip C, transfers the chip C to another suction collet 23 (reversing step), as illustrated in FIG. 4. The suction collet 23 holds the chin C through the sucking action on the chip side of the sinter-bonding material layer-associated chip C.

Figure 5:
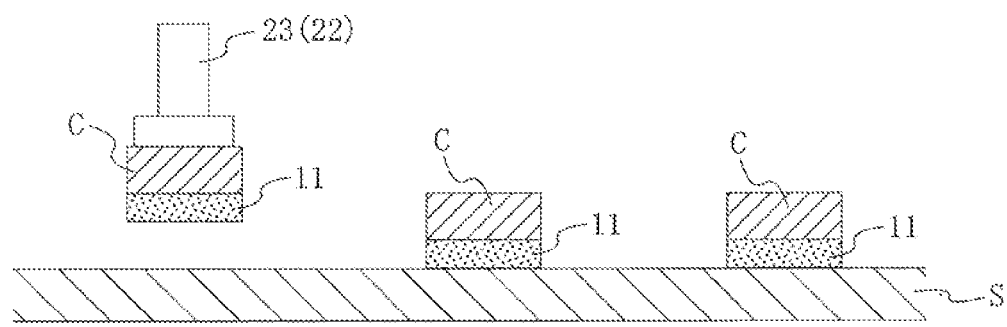
FIG. 5 (a) and FIG. 5 (b) illustrates steps subsequent to the step illustrated in FIG. 4.
Figure 5:
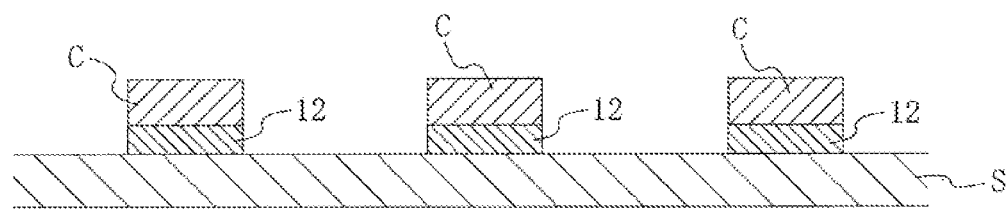

Next, each sinter-bonding material layer-associated chip C is temporarily secured, by compression bonding, through the sinter-bonding material layer 11 to a supporting substrate S (temporary securing step), as illustrated in FIG. 5(*a*). Specifically, each sinter-bonding material layer-associated chip C is pressed and thereby temporarily secured through the sinter-bonding material layer 11 to the supporting substrate S, typically using a chip mounter. Non-limiting examples of the supporting substrate S include lead frames; and insulated substrates with wiring such as copper wiring. On the supporting substrate S, the chip may be mounted on the base material (matrix) such as a copper wiring or a lead frame, or may be mounted on a plating (plating film) disposed on the base material. Non-limiting examples of the plating include gold plating, silver plating, nickel plating, palladium plating, and platinum plating. In the step, the temporary securing operates at a temperature of typically from room temperature to 300° C. by pressing under a load of typically 0.01 to 50 MPa, for a bonding time of typically 0.01 to 300 seconds.

Next, as illustrated in FIG. 5(*b*), the work receives a heating process to allow the sinter-bonding material layers 11 to convert into sintered layers 12, where the sinter-bonding material layers 11 lie between the chips C and the supporting substrate S which are temporarily secured to each other. This allows the chips C to be sinter-bonded to the supporting substrate S (sinter bonding step). Specifically, the work undergoes a predetermined high-temperature heating process, and this causes, in the sinter-bonding material layers 11 lying between the supporting substrate S and the chips C, the low-boiling binder to volatilize, causes the thermally decomposable polymer binder to thermally decompose and volatilize, and causes the conductive metal in the sinterable particles to sinter. This forms the sintered layers 12 between the supporting substrate S and the chips C and allows the chips C to bond to the supporting substrate S while establishing and keeping electrical connection with the supporting substrate S. The sinter bonding in the step operates at a temperature of typically from 150° C. to 400° C. and preferably from 250° C. to 350° C., at a pressure of typically 60 MPa or less, and preferably 40 MPa or less, for a bonding time of typically 0.3 to 300 minutes, and preferably 0.5 to 240 minutes. Typically within these condition ranges, the temperature profile and the pressure profile for performing the sinter bonding step are appropriately determined. The sinter bonding step as above can operate using an apparatus that performs heating and pressurization simultaneously. Non-limiting examples of such an apparatus include flip-chip bonders and parallel plate pressing machines. The step operates preferably in a nitrogen atmosphere, or under reduced pressure, or in a reducing gas atmosphere, from the viewpoint of eliminating or minimizing oxidation of the metal or metals involved in sinter bonding.

In the embodiment, the sintered layers 12 formed in the sinter bonding step each have a thickness of preferably from 60% to 140%, more preferably from 80% to 120%, and still more preferably from 90% to 110%, of the average thickness of the sintered layers 12. With increasing uniformity in thicknesses of the sintered layers 12, the sintered layers 12 can more readily have high bonding reliability. The average thickness of the sintered layers 12 is preferably 5 to 200 µm, and more preferably 10 to 150 µm. The configuration as above is preferred for relaxing the internal stress in the sintered layers 12 caused by heat stress, to surely have sufficient thermal-shock reliability and for reducing not only the sinter bonding cost, but also the semiconductor device production cost.

Figure 6A:
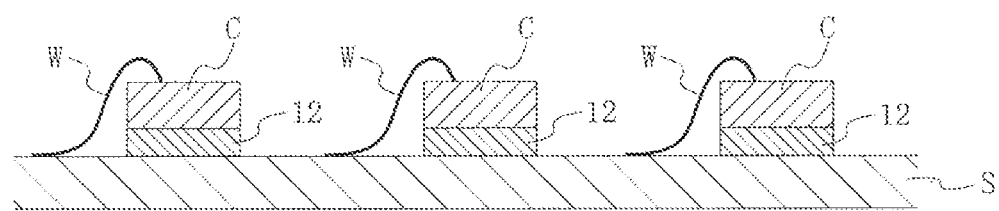
FIG. 6 (a) and FIG. 6 (b) illustrates steps subsequent to the steps illustrated in FIG. 5.

The semiconductor device manufacturing method according to the embodiment then performs a wire bonding step. In the step, a terminal area (not shown) of each chip C and a terminal area (not shown) of the supporting substrate S are electrically connected (coupled) to each other, where necessary via a bonding wire W, as illustrated in FIG. 6(a). The connection between the bonding wire W and the terminal area of the chip C or the terminal area of the supporting substrate S is provided typically through ultrasonic welding with heating. Non-limiting examples of the bonding wire W usable herein include gold wires, aluminum wires, and copper wires. The wire bonding operates at a wire heating temperature of typically 80° C. to 250° C., and preferably 80° C. to 20° C. for a heating time of from several seconds to several minutes.

Figure 6B:
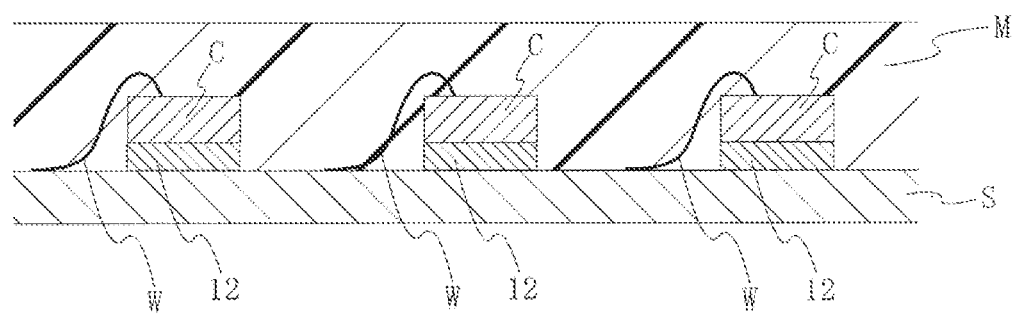

Next, a resinous encapsulant M is formed to protect the chips C and the bonding wires N on the supporting substrate S (encapsulation step), as illustrated in FIG. 6(b). In this step, the resinous encapsulant M is disposed or formed by the transfer molding technology using dies. The resinous encapsulant M may be made typically from an epoxy resin. The heating to form the resinous encapsulant M in the step operates at a temperature, typically from 165° C. to 185° C. for a time typically from 60 seconds to several minutes. The resinous encapsulant M, when not sufficiently cured in the encapsulation step, subsequently undergoes a postcure step to be fully cured.

The semiconductor device including semiconductor chips in sinter-bonded areas can be manufactured by the procedure as above.

Figure 7A:
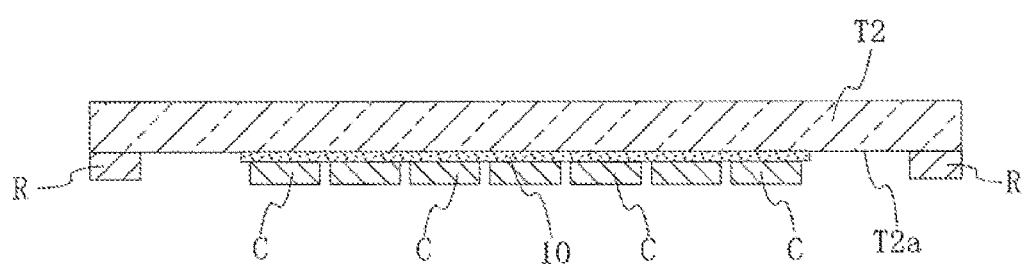
FIG. 7 (a) and FIG. 7 (b) illustrates some steps in a semiconductor device manufacturing method according to one embodiment of the present invention.

The semiconductor device manufacturing method according to the embodiment may preform a reversing step as follows after the transfer step described above with reference to FIG. 2 and before the picking-up step. The reversing step includes laminating a processing tape T2 having an adhesive face T2a onto the work (the chips C with the sinter-bonding sheet 10) after the transfer step, and removing the processing tape T1 from the work, as illustrated in FIG. 7(a). The adhesive face T2a of the processing tape T2 has an adhesive strength equal to or greater than the adhesive strength of the adhesive face T1a or the processing tape T1. In the step, the processing tape T1 is removed from the work typically after the adhesive face T2a of the processing tape T2 is laminated onto the sinter-bonding sheet 10 side of the work after the transfer step.

Figure 7B:
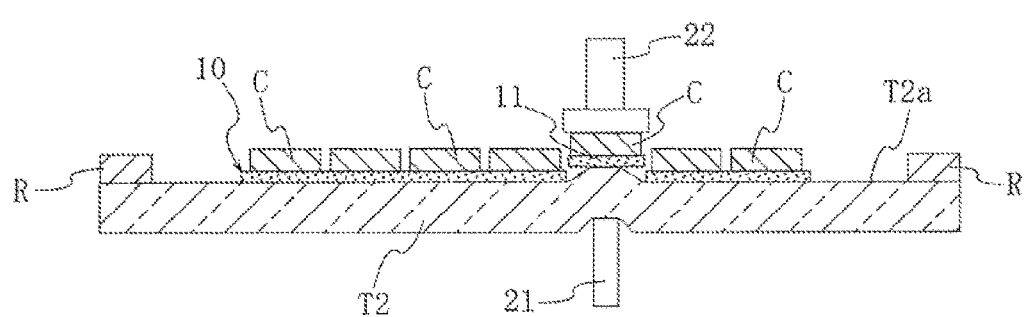

When the reversing step as above is performed, the picking-up step is performed according to an embodiment as illustrated in FIG. 7(b). Specifically, a target chip C to be picked up is plunged up through the processing tape T2 by elevating a pin lifter 21 of a picking-up mechanism from below the processing tape T2 in the figure. In this procedure, a portion of the sinter-bonding sheet 10 adhering to the chip C is divide into a piece that forms a sinter-bonding material layer 11. After the plunging up as above, the chip C is sucked and held by a suction collet 22. The resulting sinter-bonding material layer-associated chip C obtained by the above procedure will undergo the temporary securing step described above with reference to FIG. 5 (a).

In the arrangement step described above with reference to FIG. 1 in the semiconductor device manufacturing method as above, chips C to be arranged on the processing tape T1 can be selected as known good dies (KGDs), namely, as chips acknowledged as non-defective chips, acknowledged through inspections after the production process. The manufacturing method according to the embodiment can therefore subject a processing tape T1 holding the KGDs alone as chips C to the transfer step, and transfer the sinter-bonding sheet 10 serving as a sinter-bonding material to the chips C (KGDs) by batch in the transfer step. The manufacturing method according to the embodiment as above is suitable for eliminating or minimizing supply of a sinter-bonding material to chips C that are not acknowledged as non-defective chips (are acknowledged as defective chips) and accordingly suitable for reducing losses of the sinter-bonding material in batchwise supply of the sinter-bonding material to chips C.

The transfer step in the manufacturing method according to the embodiment includes laminating the sinter-bonding sheet 10 (sinter-bonding material) side of the sheet assembly K to the chips C on the processing tape T1, and removing the base B while leaving the sinter-bonding sheet 10 on the processing tape T1 or on the chips C, as described above with reference to FIG. 2. The configuration as above is suitable for efficient batchwise supply of the sinter-bonding material to each of the chips C.

In addition, the manufacturing method according to the embodiment performs the arrangement step so that the chips C are arranged on the processing tape T1 at a short chip-to-chip spacing, to allow the sinter-bonding sheet 10 to remain on the chips C upon removal of the base B in the transfer step. Assume that chips are arranged on a processing tape at an excessively long chip-to-chip spacing, and then there is performed the step of laminating a sinter-bonding sheet in a sheet assembly having a multilayer structure including a base and the sinter-bonding sheet onto the chips on the processing tape, and subsequently removing the base of the sheet assembly. In this case, when the sheet assembly base is removed, a portion of the sinter-bonding sheet is removed as associated with the base. Such removed portion of the sinter-bonding sheet leads to losses of the sinter-bonding material. In contrast, in the manufacturing method according to the embodiment, the chip-to-chip spacing of the chips C to be arranged on the processing tape T1 in the arrangement step is set to such an extent as to avoid the removal of the sinter-bonding sheet 10 in the transfer step as above, according typically to the viscosity and/or the thickness of the sinter-bonding sheet 10 to be used. The configuration as above is suitable for reducing losses of the sinter-bonding material.

As described above, the semiconductor device manufacturing method according to the embodiment is suitable for efficient supply of a sinter-bonding material to each of chips C while reducing losses of the sinter-bonding material.

Figure 8A:
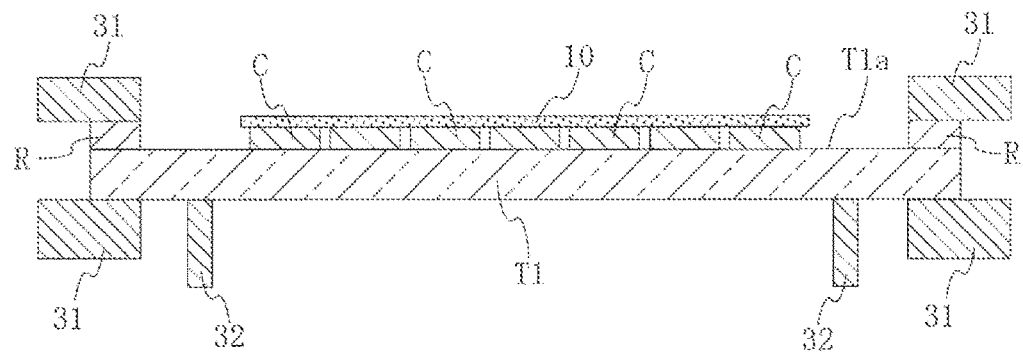
FIG. 8 (a) to FIG. 8 (c) illustrates some steps in a semiconductor device manufacturing method according to one embodiment of the present invention.

The semiconductor device manufacturing method according to the embodiment may further include a temporary expansion step between the transfer step described above with reference to FIG. 2 and the picking-up step. In the temporary expansion step, the processing tape T1 that holds the work (the chips C with the sinter-bonding sheet 10) temporarily expands, as illustrated in FIG. 8. When the method performs the reversing step described above with reference to FIG. 7 (a), the method may further include such a temporary expanding step between the transfer step described above with reference to FIG. 2 and the reversing step. In the temporary expansion step, the processing tape T1 that holds the work temporarily expands, as illustrated in FIG. 8.

Figure 8B:
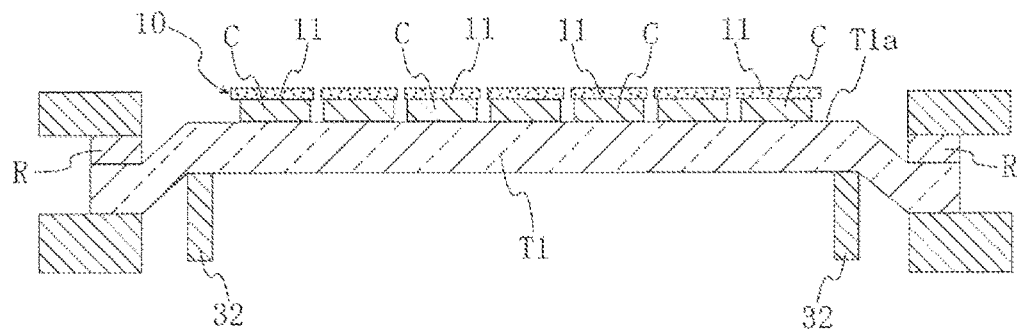
Figure 8C:
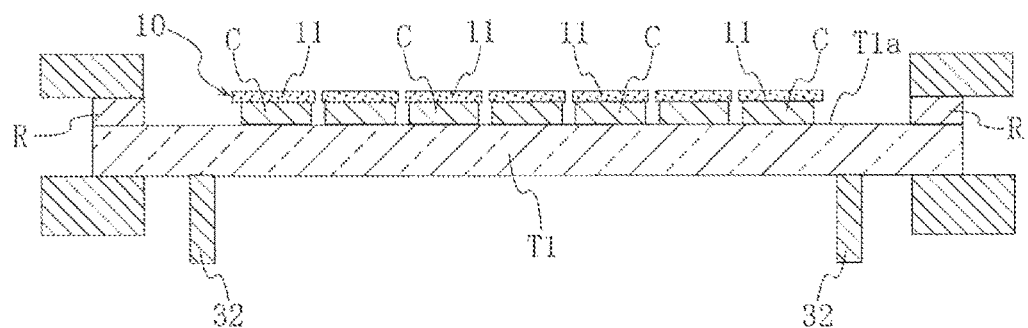

Using an expander, the expansion step operates as follows. Initially, a processing tape T1 is secured to a holder 31 of the expander as illustrated in FIG. 8 (a), where the processing tape T1 bears the work (the chips C with the sinter-bonding sheet 10) and a ring frame R on its adhesive fare T1a. Next, a hollow cylindrical plunger 32 of the expander ascends while coming in contact with the processing tape T1 from below, to expand the processing tape T1 holding the work so as to elongate the processing tape T1 in two-dimensional directions including the radial direction and the circumferential direction of the work-holding region of the processing tape T1, as illustrated in FIG. 8(b). This cleaves the sinter-bonding sheet 10 lying on and adhering to each of the chips C into pieces each forming a sinter-bonding material layer 11 on each chip C. The expansion operates at a temperature of typically −20° C. to 70° C. Thereafter the plunger 32 descends to release the processing tape T1 from the expanded state, as illustrated in FIG. 8(c). After the expansion, a portion outside of the work-holding region in the processing tape T1 may shrink by heating. The heating operates at a temperature of typically 100° C. to 300° C. The configuration as above is preferred for restraining spacing between the chips C from narrowing after the expansion.

In the step, the processing tape T1 holding the chips C adhering to one sinter-bonding sheet 10 temporarily expands, to cleave the sinter-bonding sheet 10 on the chips C into pieces each forming or defining a sinter-bonding material layer 11 on each chip C, as described above. The configuration as above is preferred for the downstream picking-up step to appropriately pick up a target chip C with a sinter-bonding material layer 11, because the sinter-bonding material layer 11 has already been separated from an adjacent sinter-bonding material layer or layers 11.

The semiconductor device manufacturing method according to the embodiment may include a blade dicing step between the transfer step described above with reference to FIG. 2 and the picking-up step. In the blade dicing step, the sinter-bonding sheet 10 is cut, as illustrated in FIG. 9. When the method performs the reversing step described above with reference to FIG. 7 (a), the method may include such a blade dicing step for cutting the sinter-bonding sheet 10 as illustrated in FIG. 9, between the transfer step described above with reference to FIG. 2 and the reversing step just mentioned above.

Specifically, this blade dicing step employs a dicer having a rotary blade and cuts, along intended cutting lines using the rotary blade, the sinter-bonding sheet 10 on the chips C held by the processing tape T1, to divide the sinter-bonding sheet 10 into pieces each forming a sinter-bonding material layer 11 on each chip C. In FIG. 9, portions cut by the rotary blade are schematically indicated by thick lines. The configuration as above is preferred for the downstream picking-up step to appropriately pick up a target chip C with a sinter-bonding material layer 11, because the sinter-bonding material layer 11 has already been separated from an adjacent sinter-bonding material layer or layers 11.

The semiconductor device manufacturing method according to the embodiment, when performing the reversing step described above with reference to FIG. 7 (a), may perform such a blade dicing step for cutting the sinter-bonding sheet 10 as illustrated in FIG. 10, between the reversing step just mentioned above and the picking up step described above with reference to FIG. 7 (b).

Specifically, this blade dicing step employs a dicer having a rotary blade and cuts, along intended cutting lines using the rotary blade, the sinter-bonding sheet 10 held together with the chips C by the processing tape T2, to divide the sinter-bonding sheet 10 into pieces each forming or defining a sinter-bonding material layer 11 on each chip C. In FIG. 10, cut portions cut by the rotary blade are schematically indicated by thick lines. The configuration as above is preferred for the downstream picking-up step to appropriately pick up a target chip C with a sinter-bonding material layer 11, because the sinter-bonding material layer 11 has already been separated from an adjacent sinter-bonding material layer or layers 11.

The semiconductor device manufacturing method according to the embodiment may further include a temporary bending step between the transfer step described above with reference to FIG. 2 and the picking-up step. In the temporary bending step, the processing tape T1 that holds the work (the chips C with the sinter-bonding sheet 10) is temporarily bent as illustrated in FIG. 11. The method, when including the reversing step described above with reference to FIG. 7 (a), may further include such a temporary bending step between the transfer step described above with reference to FIG. 2 and the reversing step just mentioned above. In the temporary bending step, the processing tape T1 that holds the work is temporarily bent, as illustrated in FIG. 11. The "bending" of the processing tape T1 includes "bending" and "curving" of the processing tape T1.

Figure 11A:
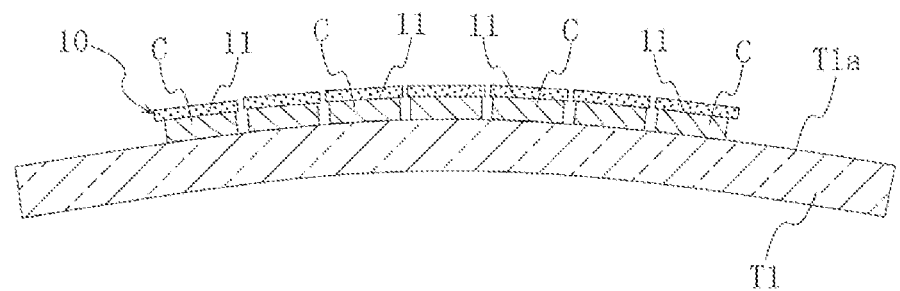
FIG. 11 (a) and FIG. 11 (b) illustrates some steps in a semiconductor device manufacturing method according to one embodiment of the present invention.
Figure 11B:
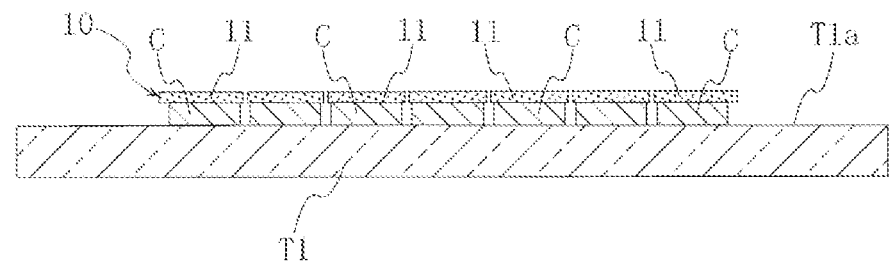

In the bending step, typically as illustrated in FIG. 11(a), the processing tape T1 that holds the chips C adhering to one sinter-bonding sheet 10 is bent, to cleave the sinter-bonding sheet 10 on the chips C into pieces each forming a sinter-bonding material layer 11 on each chip C. Thereafter the processing tape T1 is released from the deformed state, as illustrated in FIG. 11(b). The configuration as above is preferred for the downstream picking-up step to appropriately pick up a target chip C with a sinter-bonding material layer 11, because the sinter-bonding material layer 11 has already been separated from an adjacent sinter-bonding material layer or layers 11.

REFERENCE SIGNS LIST

X sheet assembly
B base
10 sinter-bonding sheet
11 sinter-bonding material layer
12 sintered layer
T1, T2 processing tape
C chip (semiconductor chip)
S supporting substrate (substrate)

The invention claimed is:
1. A method for manufacturing a semiconductor device, the method comprising
   an arrangement step of arranging a plurality of semiconductor chips on an adhesive face of a processing tape;
   a transfer step of:
      laminating a sheet assembly onto the plurality of semiconductor chips on the processing tape, the sheet assembly having a multilayer structure including a base and a sinter-bonding sheet and being laminated so that the sinter-bonding sheet faces the semiconductor chips; and
      removing the base of the sheet assembly from the sinter-bonding sheet;
   a picking-up step of picking up each of the semiconductor chips on the processing tape together with a portion of the sinter-bonding sheet adhering to the semiconductor chip, to give sinter-bonding material layer-associated semiconductor chips;

a temporary securing step of temporarily securing the sinter-bonding material layer-associated semiconductor chips through the sinter-bonding material layers to a substrate; and a bonding step of converting, through a heating process, the sinter-bonding material layers lying between the temporarily secured semiconductor chips and the substrate into sintered layers, to bond the semiconductor chips to the substrate.

2. The method for manufacturing a semiconductor device according to claim 1, further comprising an expansion step between the transfer step and the picking-up step, wherein the expansion step includes temporarily expanding the processing tape that holds the plurality of semiconductor chips, to cleave the sinter-bonding sheet on the plurality of semiconductor chips into pieces each forming a sinter-bonding material layer on each of the semiconductor chips.

3. The method for manufacturing a semiconductor device according to claim 1, further comprising a blade dicing step between the transfer step and the picking-up step, wherein the blade dicing step includes blade-dicing the sinter-bonding sheet, to divide the sinter-bonding sheet into pieces each forming a sinter-bonding material layer on each of the semiconductor chips.

4. The method for manufacturing a semiconductor device according to claim 1, further comprising a bending step between the transfer step and the picking-up step, wherein the bending step includes bending the processing tape that holds the plurality of semiconductor chips, to cleave the sinter-bonding sheet on the plurality of semiconductor chips into pieces each forming a sinter-bonding material layer on each of the semiconductor chips.

5. The method for manufacturing a semiconductor device according to claim 1, wherein the sinter-bonding sheet comprises:

a binder component; and sinterable particles containing a conductive metal.

6. The method for manufacturing a semiconductor device according to claim 1, wherein the sintered layers each have a thickness of from 60% to 140% of the average thickness of the sintered layers.

7. The method for manufacturing a semiconductor device according to claim 1, wherein the sintered layers have an average thickness of 5 to 200 µm.

8. The method for manufacturing a semiconductor device according to claim 1, wherein the sinterable particles comprise at least one selected from the group consisting of silver, copper, silver oxide, and copper oxide.

9. The method for manufacturing a semiconductor device according to claim 1, wherein the semiconductor device is a power semiconductor device.

10. The method for manufacturing a semiconductor device according to claim 1, wherein the plurality of semiconductor chips are arranged at spacing between adjacent semiconductor chips of 50 to 1000 µm.

* * * * *